(12) United States Patent
Ghandehari et al.

(10) Patent No.: US 6,589,717 B1
(45) Date of Patent: Jul. 8, 2003

(54) PHOTON ASSISTED DEPOSITION OF HARD MASK FORMATION FOR USE IN MANUFACTURE OF BOTH DEVICES AND MASKS

(75) Inventors: Kouros Ghandehari, Santa Clara, CA (US); Bruno LaFontaine, Pleasanton, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 21 days.

(21) Appl. No.: 09/715,951

(22) Filed: Nov. 17, 2000

(51) Int. Cl.$^7$ .............................. C23C 8/04; C23C 14/04
(52) U.S. Cl. ..................... 430/322; 430/324; 430/313; 430/315; 430/328; 427/552; 427/586; 427/596; 427/597
(58) Field of Search ................................ 430/322, 324, 430/313, 315, 328; 427/552, 586, 596, 597

(56) References Cited

U.S. PATENT DOCUMENTS

| | | | | |
|---|---|---|---|---|
| 5,017,317 A | * | 5/1991 | Marcus | 264/81 |
| 5,154,945 A | * | 10/1992 | Baldwin et al. | 427/596 |
| 5,285,247 A | * | 2/1994 | Itoh | 347/130 |
| 5,650,361 A | * | 7/1997 | Radhakrishnan | 438/779 |
| 5,861,233 A | * | 1/1999 | Sekine et al. | 216/41 |

OTHER PUBLICATIONS

O. R. Wood II et al., "Use of Attenuated Phase Masks in Extreme Ultraviolet Lithography," Journal of Vacuum Science and Technology B, vol. 15, Nov./Dec. 1997, pp. 2448–2451.

R. Zanoni et al., "Synchrotron–Radiation–Stimulated Tungsten Deposition on Silicon from $W(CO)_6$," Journal of Vacuum Science and Technology A, vol. 9, No. 3, May/Jun. 1991, pp. 931–934.

J. M. Calvert et al., "Projection X–Ray Lithography With Ultrathin Imaging Layers and Selective Electroless Metallization," Optical Engineering vol. 32, No. 10, Oct. 1993., pp. 2437–2445.

H. Kyuragi et al., "Synchrotron Radiation–Excited Chemical Vapor Deposition of Silicon Nitride Films from $SiH_4$+ $NH_3$ Gas Mixture," Journal of the Electrochemical Society, vol. 138, No. 11, Nov. 1991, pp. 3412–3416.

Y. Matsui et al., "Low–Temperature Growth of $SiO_2$ Thin Film by Photo–Induced Chemical Vapor Deposition Using Synchrotron Radiation," Japanese Journal of Applied Physics, Part I, vol. 31 n.6B, Jun. 1992, pp. 1972–1978.

J. F. Moore et al., "Deposition of Dielectric Thin Films by Irradiation of Condensed Reactant Mixtures," Materials Research Society Symposium Proceedings, vol. 335, 1994, pp. 81–86.

I. Nishiyama et al.,"Photon Energy Dependence of Synchrotron Radiation Induced Growth Suppression and Initiation in Al Chemical Vapor Deposition II, Surface Analysis by Auger Electron Spectroscopy," Applied Surface Science, vol. 103, 1996 pp. 299–306.

\* cited by examiner

*Primary Examiner*—Mark F. Huff
*Assistant Examiner*—Daborah Chacko-Davis
(74) *Attorney, Agent, or Firm*—Foley & Lardner

(57) ABSTRACT

An exemplary method of selectively patterning a hard mask or reticle using a laser to cause deposition of hard mask material in locations forming the hard mask pattern. This method can include providing a vapor in a vapor chamber containing an integrated circuit substrate, and applying a laser to selected areas of the integrated circuit substrate to cause a reaction with the vapor and create a structure on the integrated circuit substrate.

20 Claims, 4 Drawing Sheets

PHOTON ASSISTED DEPOSITION OF HARD MASK FORMATION FOR USE IN MANUFACTURE OF BOTH DEVICES AND MASKS

FIELD OF THE INVENTION

The present specification relates generally to the field of integrated circuits and to methods of manufacturing integrated circuits and the masks or reticles used to manufacture these devices. More particularly, the present specification relates to photon assisted deposition for hard mask formation on both device substrates and mask substrates.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of devices on an IC, there is still a need to decrease the size of IC device features, and, thus, increase the number of devices on an IC.

One limitation to the smallness of IC critical dimensions is lithography. In general, projection lithography refers to processes for pattern transfer in various media on the substrate. It is a technique used for integrated circuit fabrication in which a silicon slice, the wafer, is coated uniformly with a radiation-sensitive film, the resist, and an exposing source (such as laser radiation, x-ray photons, or an electron beam) illuminates selected areas of the surface through an intervening master template, the mask, or reticle, for a particular pattern. The lithographic coating or photoresist is generally a radiation sensitive coating suitable for receiving a projected image of the subject pattern. Once the image is projected, it is indelibly formed in the coating. The projected image may be formed using either negative or positive tone photoresist.

Exposure of the coating through a mask causes the image area to become selectively crosslinked where irradiated in the case of a negative tone photoresist and consequently less soluble in the developer fluid where the resist has been exposed. In the case of a positive tone resist, the exposed regions are rendered more soluble than the rest of the film due to deprotection of the polymers in the film where exposed to the imaging radiation. Subsequent to imaging using either tone of resist, the more soluble areas are removed in a developing process to leave the pattern image in the coating as the less soluble polymer. For both cases of resist types the difference in solubility is substantial so that a pattern with good fidelity is formed in the photoresist coating.

The pattern which results in photoresist from lithographic processing is used as a mask for the subsequent plasma etching of the underlying layer or layers. The plasma etch process directs chemical species to bombard the surface and remove material from the layer by means of chemical processes between species in the excited state in the plasma and the wafer surface. If the photoresist is durable enough for the etch warranted for the layer beneath, the resist mask enables transfer of the pattern to the underlying layer by means of the plasma etch process. If the resist mask by itself does not withstand the etch process necessary to etch the underlying layers an additional thin hard mask layer between the resist and the underlying layers to be patterned by the etch process is necessary. In that case, the resist mask is used with one type of etch process to etch the hard mask and a subsequent differing type of etch process to pattern the layers beneath. The final type of etch process does not attack the hard mask and is able to use the hard mask to prevent removal of the material in the desired areas as determined by the original pattern in the photoresist.

Projection lithography is a powerful and essential tool for microelectronics processing. As feature sizes are driven smaller and smaller, optical systems are approaching their limits due to the resolution capability of the combination of the wavelengths of optical radiation and photoresist in use by these systems.

Conventional lithography techniques often utilize a combination of photo-masks or reticles and hard masks to transfer patterns between various layers during integrated circuit fabrication. A hard mask is a layer of material on an integrated circuit wafer which prevents chemical removal of materials below the mask during plasma etch. A reticle is a patterning tool which contains patterns that can be transferred to an entire integrated circuit wafer in one or more exposures by means of a photoresist coating on the substrate being exposed.

Using a hard mask can increase the resolution capability of the manufacturing process by improving the plasma etch process capability by allowing a thinner resist coating to be used which will allow smaller dimensions to be produced in the resist and subsequently in the films comprising the semiconductor device on the wafer.

Another method of improving the device manufacturing capability is to improve the resolution capability of the reticle itself. Typically a reticle used in projection lithography has a 4×or 5×reduction factor so that reducing the minimum feature on the reticle substrate leads to a reduction in the size of the features at the wafer surface. The reticle substrate is coated with layers that are etched in an analagous method to the semiconductor device manufacture using a resist mask produced by exposure to radiation of some sort. Typically the layers are not made using a reticle or mask but rather are written by scanning the radiation from a database held in a computer.

There are several advanced techniques for forming reticles that allow more aggressive imaging resolution capabilities. These include phase shifting masks (PSMs) where the area surrounding the mask feature to be imaged are shifted in phase so as to interfere with the adjacent image from the pattern and create a smaller feature at the wafer surface. Here again, hard masks can be used to improve the manufacturing capability of reticles depending on the films used on the reticle substrates. For some types of phase shifting masks, the addition of the hard mask material itself can form the phase shifting region while for other types of PSMs the hard masks itself can be a layer which acts both as an etching hard mask and a film with optical properties enabling the phase shifting nature of that type of PSM.

Hard masks are generally created by depositing a material in blanket form by chemical vapor deposition (CVD). Subsequently, a pattern is etched from the hard mask layer using a photoresist mask and a variety of different etching or removal techniques. Due to the thickness of the resist and the response of the resist with the imaging system, the resolution capability of conventional systems is limited even with a hard mask. Thus, there is a need to use a photon assisted CVD type of deposition with either laser or synchroton radiation which allows direct patterning of hard mask layers without resist and allow for even greater resolution by selectively growing a thin layer of the hard mask at the sites irradiated by the photon.

Since there is a limitation to the resolution achievable with resist based pattern transfer with or without use of a hard mask to pattern the underlying layer, there is a need to pattern IC devices and reticles using non-conventional lithographic techniques. Furthermore, when patterning with hard masks, there is a need to use an alternative to forming a blanket of hard mask material over the surface of the integrated circuit wafer or the reticle since this must subsequently be etched with a resist based masking process. Yet further, there is a need for photon assisted deposition for hard mask formation due to the resolution enhancing capabilities of this non-resist based lithography since the layer can be selectively grown as a pattern for integrated circuit features.

SUMMARY OF THE INVENTION

An exemplary embodiment is related to a method of selectively patterning a hard mask or reticle using a laser, soft x-ray, or e-beam radiation source to cause deposition of hard mask material in locations forming the hard mask pattern. This method can include providing a vapor in a vapor chamber containing an integrated circuit substrate, and applying a laser or the light source to selected areas of the integrated circuit substrate to cause a reaction with the vapor and create a structure on the integrated circuit substrate.

Another exemplary embodiment is related to a system for forming a hard mask or reticle. This system can include a vapor chamber, means for dispensing chemical vapor precursors from a source located in the vapor chamber, an integrated circuit wafer in the vapor chamber, a radiation source which selectively provides laser light, soft x-ray, or e-beam radiation to the integrated circuit wafer such that there is a reaction with chemicals in the chemical vapor causing a deposition of the material where the radiation is applied.

Another embodiment is related to a method of material deposition in the formation of a hard mask or reticle configured to form features on an integrated circuit wafer. This method can include providing a chemical vapor deposition (CVD) vapor in a vapor chamber, and illuminating a portion of an integrated circuit wafer surface of an integrated circuit wafer located in the vapor chamber using light. The light causes a reaction with chemicals in the CVD vapor. The illuminated portion defines geometric patterns for a hard mask.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
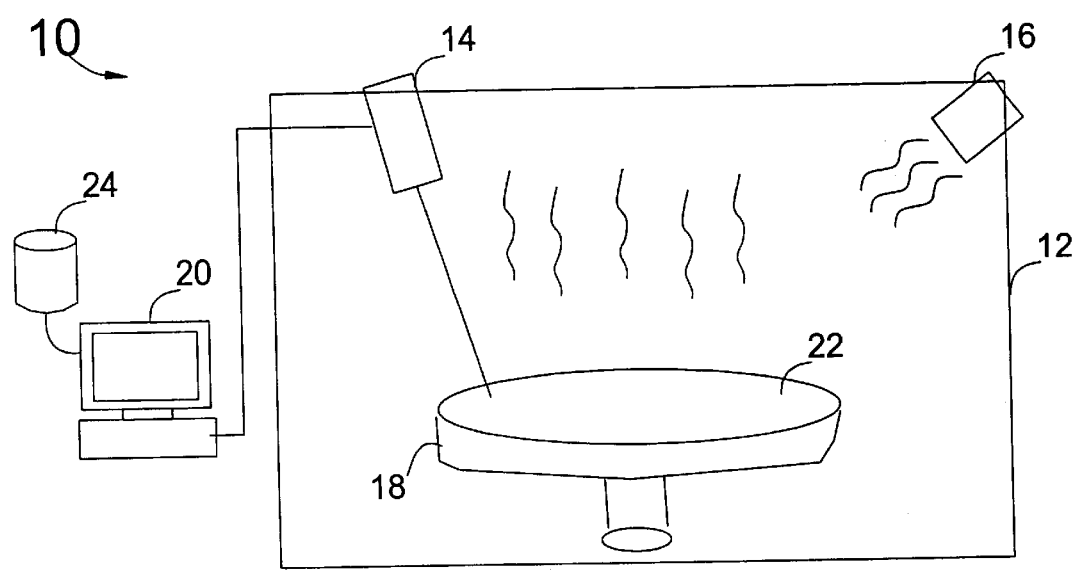
FIG. 1 is a diagrammatical representation of a hard mask formation system in accordance with an exemplary embodiment.

Referring to FIG. 1, a hard mask formation system 10 includes a chamber 12, a light source 14, a vapor source 16, an integrated circuit wafer supporting structure 18, and a computing device 20. Chamber 12 is an enclosed structure allowing for a vacuum,type reactor with gases as reactants in the formation of structures in integrated circuit fabrication. Light source 14 can be any laser producing mechanism capable of providing a light which is either a UV laser, or soft x-ray source where the UV laser can be an excimer source or a $4^{th}$ harmonic of the Nd:YAG laser at 266 nm and the soft x-ray source can be between 100 nm and 1 nm or else a EUV source at 13.4 nm.

Vapor source 16 can be any vapor producing mechanism capable of providing a vapor which is a CVD vapor precusor to the material being deposited for the given reaction with the light at the substrate surface. In an exemplary embodiment, vapor material source 16 provides precusor chemicals for inorganic material, such as, $SiO_2$ or Ni in vapor form for deposition by vapor phase epitaxy or other types of chemical vapor deposition (CVD). In alternative embodiments, vapor source 16 is a source of other types of chemical vapors.

Integrated circuit wafer supporting structure 18 provides support for an integrated circuit wafer 22. In an exemplary embodiment, integrated circuit wafer supporting structure 18 can be rotated to facilitate deposition of materials on integrated circuit wafer 22. In another exemplary embodiment, integrated circuit wafer supporting structure can be maneuvered in a variety of directions to facilitate hard mask fabrication and other integrated circuit fabrication steps. As used in this application, the term wafer refers to any substrate used in the integrated circuit fabrication processes or layer above such a substrate. The substrate or layer can be conductive, semiconductive, or insulative.

Computing device 20 can be a personal computer (PC) or a computer workstation coupled to a computer aided design/computer-aided manufacturing (CAD-CAM) data base 24. Computing device 20 is communicatively coupled to light source 14 to provide control signals which selectively move light source 14 to apply a laser or radiation to desired areas. In an exemplary embodiment, computer device 20 is a workstation or computer powered by a microprocessor manufactured by Advanced Micro Devices, Inc. (AMD) of Sunnyvale, Calif.

In operation, hard mask formation system 10 provides a chemical vapor precursor of an inorganic material, such as, Al, Ni, W, $SiO_2$, $Si_3N_4$, or $Al_2O_3$ from vapor source 16. As such, chemical vapor is provided to chamber 12. Light source 14 provides heat or a photochemical reaction necessary to cause or achieve a reaction with the vapor chemicals in chamber 12. As such, deposition of the vapor chemicals occurs on integrated circuit wafer 22 where the radiation from light source 14 is provided. This deposition forms a hard mask on integrated circuit wafer 22 according to a pattern created by movement of light source 14 and the reaction of the radiation with vapor chemicals.

In an exemplary embodiment, instead of moving light source 14 to move laser light or radiation to different areas of integrated circuit wafer 22, wafer supporting structure 18 is selectively moved using any of a variety of means. In such an embodiment, integrated circuit wafer supporting structure 18 is in communication with computing device 20 which controls its movement. In another exemplary embodiment, light source 14 is moved using a precision motive device. Other mechanisms and arrangements for selectively maneuvering light source 14 may be utilized. In particular, various arrangements and utilities may allow for greater accuracy of movement of light source 14 to achieve precisely directed movement of light from light source 14.

Advantageously, instead of forming a blanket of the material of interest over the entire surface of integrated circuit wafer 22 and then etching the feature into a hard mask, hard mask formation system 10 makes it possible to use light to illuminate the surface of integrated circuit wafer 22 and form a reaction with chemicals in the gas phase such that deposition occurs. In an alternative embodiment, integrated circuit wafer 22 is coated with an assisting chemical, such as, an organosilane (e.g., (aminoethylaminomethyl) phenethyltrimethoxysilane (PEDA) or 4-chloromethylphenyltrichlorosilane (CMPTS)) which assists or facilitates the reaction between the light and vapor chemicals.

Utilizing hard mask formation system 10, dielectrics could be formed to serve as hard masks or, alternatively, metal lines could be formed for interconnect. The light from radiation source 14 can be controlled by computing device 20 utilizing CAD-CAM database 24 to pattern any of a variety of integrated circuit features. If metal lines are formed for an interconnect layer, a second application of light in selected areas can be used to form posts. Subsequently, the entire wafer can be covered with a dielectric material to form damascene in reverse order. Ordinary damascene involves etching an insulating layer with holes and trenches and then depositing metal in the holes and trenches so that interconnect lines are made in the insulating layer which connect to layers above and below the layer which was etched for the holes and trenches. This can be done in as many iterations as necessary to build up the layers necessary to connect the different sections of the integrated circuit device. In an exemplary embodiment, there can be up to 5 or more layers.

In a reverse application of damascene, interconnect lines and posts are formed and then the oxide or insulating material is applied over it. This can be done in multiple iterations to form all necessary layers for the IC as well. A film of $Si_3N_4$ can be deposited as a barrier liner over metal lines to prevent diffusion into the oxide.

Furthermore, in an exemplary embodiment, multiple sequential layers can be used to build up the back end of integrated circuit wafer 22 (utilizing hard mask formation system 10) in addition to just one layer for a hard mask or one layer for a metallic interconnect. As such, advantageously, hard mask formation system 10 may be utilized multiple times for a single integrated circuit wafer forming a variety of different masks or patterns used in the fabrication of the integrated circuit.

Figure 2:
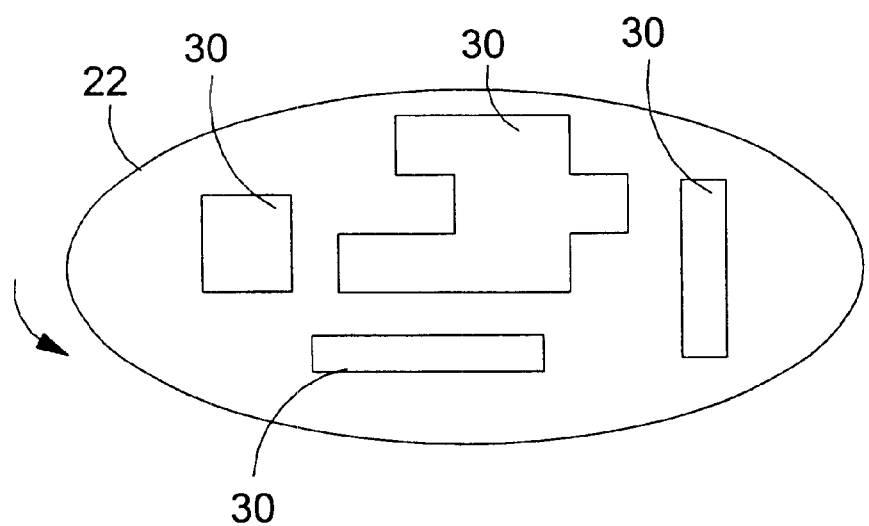
FIG. 2 is a top view of an integrated circuit wafer including a hard mask manufactured in accordance to an exemplary embodiment.

Referring now to FIG. 2, a top view of integrated circuit wafer 22 is illustrated after application of a laser from light source 14 to form hard mask structures 28. Hard mask structures 28 can be comprised of materials, such as, Al, Ni, W, $SiO_2$, $Si_3N_4$, or $Al_2O_3$. Hard mask structures 28 can be utilized in the formation of metal lines, posts, gates, or any other integrated circuit feature including features used in intermediate steps of the integrated circuit fabrication process.

As discussed above, there is a push for development of next generation lithographic systems in many areas. One area is Extreme Ultra Violet (EUV) systems which employ 13.4 nm wavelength radiation. In an exemplary embodiment, photo assisted CVD described with reference to FIGS. 1–2 is used to create an attenuating phase shifting mask using a combination of Ni and Al as the absorbing phase shifters.

Figure 3:
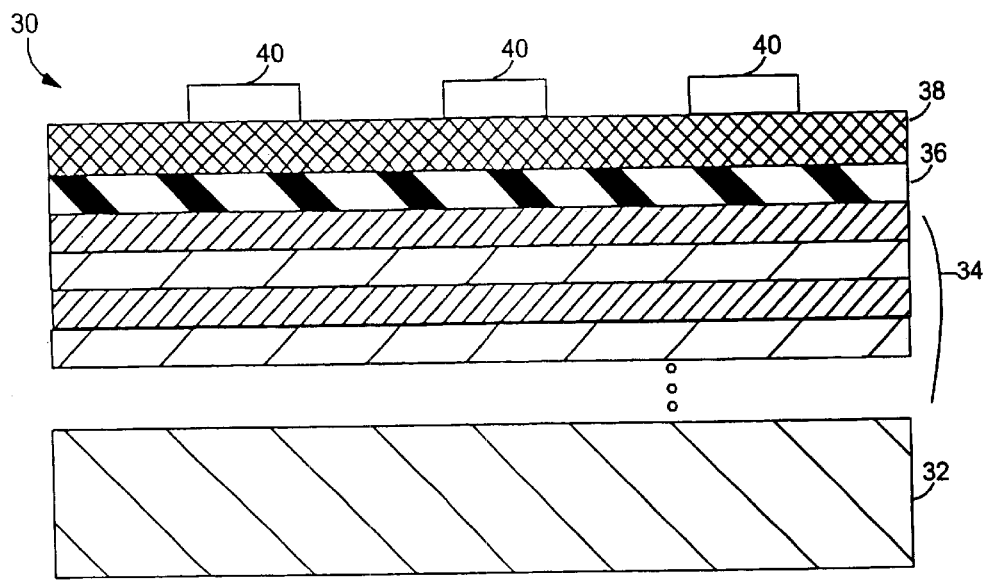
FIG. 3 is a cross-sectional view of a portion of a reflecting EUV attenuating phase shift mask fabricated in accordance with an exemplary embodiment.

In an exemplary embodiment, one type of mask blank (an unpatterned mask) used for EUV lithography can be a reflecting mask constructed from a Si wafer over which a multilayer mirror is constructed from alternating layers of Si and Mo. On the surface of the multilayer, a buffer layer of 500 Å $SiO_2$ is made to allow for defect repair and etch protection during feature patterning. Above the buffer layer, the features are normally deposited and patterned. After the features on the mask are patterned, the $SiO_2$ layer is etched in areas other than the features to reveal the multi-mirror surface. FIG. 3 illustrates a portion 30 of an integrated circuit including a substrate 32, a multilayer mirror 34, a buffer layer 36, an aluminum layer 38, and a hard mask 40. In an exemplary embodiment, hard mask 40 is a Ni hard mask which is grown selectively by photon assisted CVD. Multilayer mirror layer 34 can be constructed from alternating layers of silicon (Si) and molybdenum (Mo). In an exemplary embodiment, there are 40 layers in multilayer mirror in total with each silicon (Si) layer being 4 nm while the molybdenum (Mo) layers are 3 nm. The 40 layers gives a mask blank with 65–70% reflectivity to the 13.4 nm EUV radiation.

The features of portion 30 can be completely absorbing which would result in an ordinary binary mask or they can be partially reflecting and 180° out of phase which would result in a phase shifting mask (in reflection) for the mask. The phase shifting mask (PSM) yields smaller critical dimensions (than a binary mask) at the wafer surface due to the interference effect between the high reflective EUV mirror mask surface and the partially reflecting surface of the mask feature. Normal optical PSM masks are partially transmitting with a 180° phase difference in the feature and a transmission level between 5 and 15%.

In an exemplary embodiment, the Ni in hard mask 40 and Al layer 38 serves as a partial reflector in portion 30. In an exemplary embodiment, the mirror surface with the $SiO_2$ buffer layer 36 removed has a 65% reflectivity with phase of 180°. Thicknesses of the 40 layers of silicon (Si) and molybdenum (Mo) in multilayer mirror 34 can be 40 Å Si and 30 Å Mo. In an exemplary embodiment, the top of these 40 layers is covered with a 100 Å layer of Si as a cap. In the area of the reflector, 500 Å of $SiO_2$ is used (buffer layer 36). Buffer layer 36 is first applied over the entire surface of the reflecting mask but etched and remains only under the features covered by the partial reflectors.

In an exemplary embodiment, two separate periods are used to demonstrate the Ni/Al partial reflector (hard mask 40 and Al layer 38): 1) Ni with 4× thickness of Al beneath and 2) Ni with 5× thickness of Al beneath. The reflectivity for selected thicknesses of Ni (with corresponding 4× or 5× thicknesses of Al beneath) give rise to phase differences from the mirror surface of 180° difference (0 degrees for the Ni/Al reflector) and relative percent reflectivity vs. the mask mirror reflectivity (65% absolute) of 13% to 2%.

Exemplary relative reflectivity values are provided in Table 1. Theoretical calculations using Fresnel coeffecients and the matrix propagation method as shown in O.S. Heavens: "Optical Properties of Thin Solid Films", Section 4.8, are used to calculate the reflectivity at the surfaces for the EUV reflecting mask shown here.

TABLE 1

| Thickness of NI | Thickness of Al | Relative Reflectivity |
| --- | --- | --- |
| Ni | 4X Al | |
| 25.2 Å Ni | 100.8 Å Al | 12.8% |
| 36.5 Å Ni | 146 Å Al | 8.7% |
| 47.5 Å Ni | 190 Å Al | 6.32% |
| 58.7 Å Ni | 234.8 Å Al | 3.95% |
| 70.3 Å Ni | 281.2 Å Al | 1.93% |
| Ni | 5X Al | |
| 21.5 Å Ni | 107.5 Å Al | 13.5% |
| 31.3 Å Ni | 156.5 Å Al | 8.9% |
| 40.8 Å Ni | 204 Å Al | 6.45% |
| 50.3 Å Ni | 251.5 Å Al | 4.6% |
| 59.9 Å Ni | 299.5 Å Al | 2.8% |

In an exemplary embodiment, to form the EUV reflecting mirror, Al layer 38 is blanket coated over buffer layer 36 using photon assisted CVD until a certain thickness of Al is reached. It is possible that by using the right level of light intensity (e.g. from light source 14), the thickness of Al could be controlled sufficiently to make the features for the PSM. Above the blanket layer (aluminum layer 38), the Ni layer (hard mask 40) is grown selectively by photon assisted CVD to form a hard mask and the Al and $SiO_2$ beneath the Ni hard mask are etched. Al layer 38 could also be formed by PVD (physical vapor deposition) or other methods.

Figure 4:
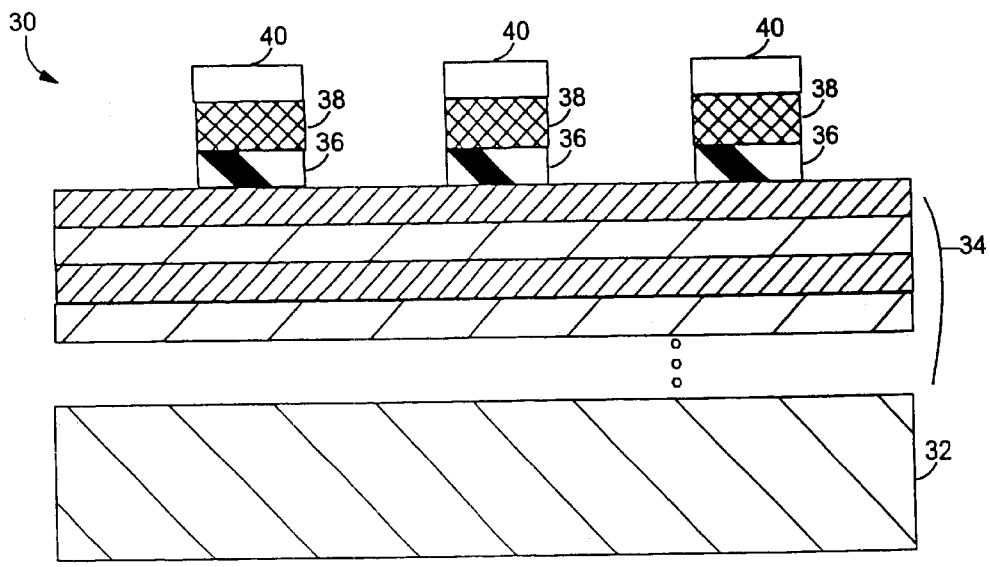
FIG. 4 is a cross-sectional view of the portion of the reflecting EUV attenuating phase shift mask of FIG. 3 after an etching step.

FIG. 4 illustrates portion 30 after an etching step has been performed in which portions of buffer layer 36 and aluminum layer 38 are removed. The thicknesses of hard mask 40 and aluminum layer 38 are variable. $SiO_2$ can have a thickness of 500 Å. In multilayer mirror 34, silicon layers can have a thickness of 40 Å and molybdenum a thickness of 30 Å. Advantageously, the method described with reference to FIGS. 1–3 results in the creation of integrated circuit features of less than one minimum lithographic feature.

Figure 5:
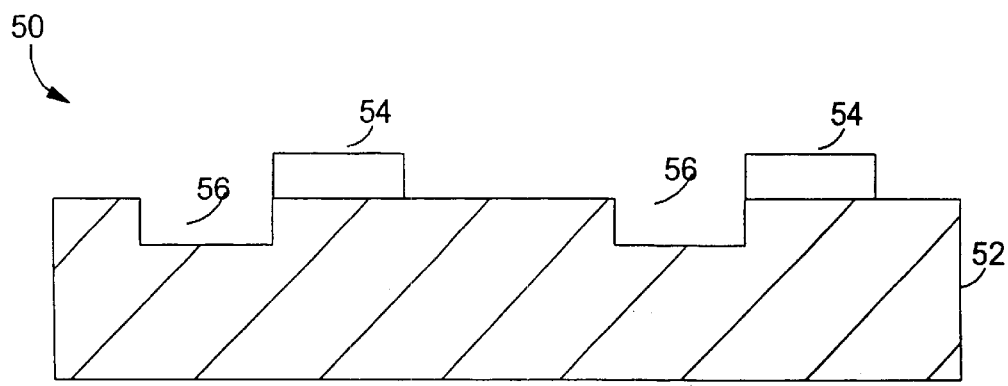
FIG. 5 is a cross-sectional view of a portion of an alternating phase shift mask according to a conventional fabrication technique.

FIG. 5 illustrates a conventional alternating phase shifting mask 50 including a reticle substrate 52 and phase shifting features 54. In conventional systems, trenches are etched into reticle substrate 52 on one side of features 54. Typically, features 54 are chrome. Trenches 56 in reticle substrate 52 are positioned such that the phase is shifted with respect to the phase in reticle substrate 52 by 180 degrees.

Conventional alternating phase shifting mask 50, includes an opaque layer which is patterned into phase shifting features 54. In an exemplary embodiment, phase shifting features 54 are chrome (Cr). Many layers such as antireflects or other alternatives for the opaque materials could be used. To one side of the Cr feature on the mask, trenches 56 are etched so that in that region, a 180° phase shift is induced. The light from trenches 56 interferes with light of the same intensity but of opposing phase (0 phase) from the other edge of phase shifting feature 54. This interference is destructive due to the 180° phase difference so that the size of the feature is reduced. The reason that the signals can interfere is that phase shifting feature 54 is small enough on the mask that the light is diffracted and light from trenches 56 and phase shifting feature 54 is scattered so that each side has a tail that is interfering with the other side due to the 180 degree phase difference.

The depiction of a trench on one side and none on the other is exemplary schematic. Algorithms exist to generate the masks with the trench areas defined in other locations so to give the best phase shifting mask (PSM) effect.

Figure 6:
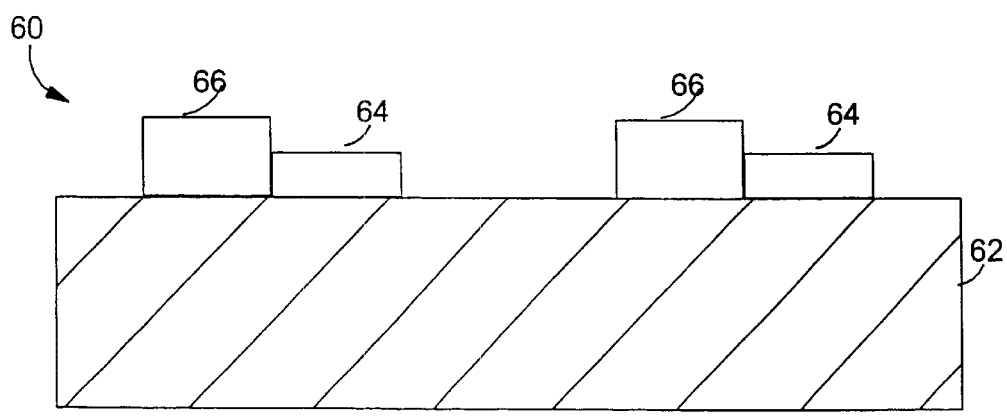
FIG. 6 is a cross-sectional view of a portion of an alternating phase shifting mask according to an exemplary embodiment.

FIG. 6 illustrates a portion 60 of a phase shifting mask in accordance with an exemplary embodiment. Utilizing photon assisted CVD as described with reference to FIGS. 1–4, additional material may be deposited on top of reticle substrate 62 and proximate opaque mask features 64. In an exemplary embodiment, opaque mask features 64 are opaque materials, such as, chrome. Additional material deposited in a position proximate to opaque mask feature 64 form phase shifting regions 66 which are configured to cause a 180° phase shift with respect to reticle substrate 62. Opaque mask features 64, such as, chrome represent opaque features for the mask to define a pattern.

In accordance with an exemplary embodiment, instead of etching out the trench, oxide material, such as $SiO_2$, is grown selectively by photon assisted CVD on one side until the necessary thickness is achieved to induce a 180° phase shift between phase shifting regions 66 where the material is grown and the mask blank region (reticle substrate 62) which is left unchanged. The amount of material necessary is similar to the amount etched away in the conventional method described with reference to FIG. 5 since $SiO_2$ is being deposited and the mask is made out of fused silica which is a form of $SiO_2$. However, when depositing materials, there will be a difference in optical properties due to the exact density of the deposited material even though the layer may be chemically similar to the mask.

While the embodiments illustrated in the FIGURES and described above are presently preferred, it should be understood that these embodiments are offered by way of example only. Other embodiments may include, for example, different arrangements or numbers of laser or radiation sources as well as different vapor deposition mechanisms. The invention is not limited to a particular embodiment, but extends to various modifications, combinations, and permutations that nevertheless fall within the scope and spirit of the appended claims.

What is claimed is:

1. A method of selectively patterning a hard mask on an integrated circuit wafer or reticle substrate using a laser to cause deposition of hard mask material in locations forming the hard mask pattern, the method comprising:
   providing a vapor in a vapor chamber containing a substrate; and
   applying a laser beam to selected areas of the substrate to cause a reaction between the laser beam and the vapor to create a structure on the substrate in the selected areas.

2. The method of claim 1, wherein the step of providing a vapor in a vapor chamber comprises performing vapor phase epitaxy including a vacuum type reactor.

3. The method of claim 1, further comprising forming metal lines on the substrate.

4. The method of claim 1, further comprising using the created structure to form a phase shifting mask of any one of an alternating phase shift mask and a reflecting attenuating phase shift mask.

5. The method of claim 1, further comprising applying the laser beam to another set of selected areas to form posts.

6. The method of claim 1, wherein the laser is applied to selected areas, the selected areas are coated with an assisting chemical.

7. The method of claim 1, further comprising building multiple sequential layers by application of the laser beam.

8. The method of claim 1, further comprising receiving communications from a computing device to direct application of the laser beam.

9. The method of claim 1, further comprising depositing a phase shifting material to form an alternating phase shifting mask.

10. The method of claim 1, wherein the vapor comprises a vapor precursor for the hard mask material to be deposited.

11. The method of claim 1, wherein the reaction between the laser beam and the vapor is one of a heat and a photochemical reaction.

12. A method of forming a hard mask on a substrate comprising:

providing a substrate in a vapor chamber;

providing a vapor in the vapor chamber; and applying radiation to at least a portion of the substrate, the radiation reacting with the vapor to form a patterned hard mask at said portion of the substrate.

13. The method of claim 12, wherein the step of providing a vapor in the vapor chamber comprises performing vapor phase epitaxy.

14. The method of claim 12, wherein the radiation comprises laser light.

15. The method of claim 12, wherein the portion of the substrate is coated with an assisting material.

16. The method of claim 15, wherein the assisting material is an organosilane material.

17. A method of forming structures on a substrate comprising:

providing a substrate in a vapor chamber;

introducing a vapor in the vapor chamber, the vapor being configured to react with laser radiation; and directing laser radiation at selected areas of the substrate, wherein the vapor reacts with the laser radiation at the selected areas to form structures at the selected areas.

18. The method of claim 17, wherein the step of applying a laser beam to selected areas of the substrate comprises moving the substrate in relation to the laser beam.

19. The method of claim 18, wherein the structures are formed from one of a dielectric and a metal material.

20. The method of claim 18, further comprising coating the substrate with an organosilane assisting chemical prior to the step of directing laser radiation at selected areas of the substrate.

* * * * *